United States Patent
Huang

(10) Patent No.: US 10,955,966 B2
(45) Date of Patent: Mar. 23, 2021

(54) TOUCH ELECTRODE DRIVING CIRCUIT, TOUCH ELECTRODE DRIVER AND TOUCH DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventor: Fei Huang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/641,672

(22) PCT Filed: Apr. 11, 2019

(86) PCT No.: PCT/CN2019/082208
§ 371 (c)(1),
(2) Date: Feb. 25, 2020

(87) PCT Pub. No.: WO2019/196893
PCT Pub. Date: Oct. 17, 2019

(65) Prior Publication Data
US 2020/0387282 A1     Dec. 10, 2020

(30) Foreign Application Priority Data
Apr. 13, 2018  (CN) .......................... 201810330563.5

(51) Int. Cl.
*G06F 3/041*  (2006.01)
*G06F 3/045*  (2006.01)
(Continued)

(52) U.S. Cl.
CPC ........ *G06F 3/04164* (2019.05); *G06F 3/0412* (2013.01); *G06F 3/0443* (2019.05);
(Continued)

(58) Field of Classification Search
CPC ....... G06F 3/0412; G06F 3/044; G06F 3/0416
See application file for complete search history.

(56) References Cited

U.S. PATENT DOCUMENTS

2016/0049126 A1   2/2016   Zhang et al.
2018/0348922 A1  12/2018   Luo et al.

FOREIGN PATENT DOCUMENTS

CN   104036738   9/2014
CN   105427829   3/2016
(Continued)

OTHER PUBLICATIONS

Office action from Chinese Application No. 201810330563.5 dated May 11, 2019.

*Primary Examiner* — Nan-Ying Yang
(74) *Attorney, Agent, or Firm* — Calfee, Halter & Griswold LLP

(57) ABSTRACT

A touch electrode driving circuit, a touch electrode driver, and a touch display device. The touch electrode driving circuit being operable to output touch scan signals to two touch electrodes. The touch electrode driving circuit includes an input terminal, a reset terminal, a first voltage terminal, a second voltage terminal, a third voltage terminal, a fourth voltage terminal, a common voltage signal terminal, a first common voltage signal control terminal, a second common voltage signal control terminal, a first clock signal terminal, a second clock signal terminal, a third clock signal terminal, a fourth clock signal terminal, a touch signal
(Continued)

terminal, a touch control signal terminal, a first output terminal, a second output terminal, and a third output terminal.

19 Claims, 5 Drawing Sheets

(51) Int. Cl.
    *G09G 3/20*     (2006.01)
    *G06F 3/044*     (2006.01)

(52) U.S. Cl.
    CPC ... *G09G 3/2092* (2013.01); *G09G 2300/0426* (2013.01); *G09G 2310/08* (2013.01)

(56) References Cited

FOREIGN PATENT DOCUMENTS

| | | |
|---|---|---|
| CN | 105446544 | 3/2016 |
| CN | 105788555 | 7/2016 |
| CN | 105845098 | 8/2016 |
| CN | 106531120 | 3/2017 |
| CN | 106847220 | 6/2017 |
| CN | 107491208 | 12/2017 |
| CN | 108536334 | 9/2018 |
| KR | 10-1691492 | 12/2016 |

TOUCH ELECTRODE DRIVING CIRCUIT, TOUCH ELECTRODE DRIVER AND TOUCH DISPLAY DEVICE

CROSS REFERENCE TO RELATED APPLICATION

The present application is a 35 U.S.C. 371 national stage application of PCT International Application No. PCT/CN2019/082208, filed on Apr. 11, 2019, which claims the benefit of Chinese Patent Application No. 201810330563.5, filed on Apr. 13, 2018, the entire disclosures of which are incorporated herein by reference.

TECHNICAL FIELD

The disclosure relates to generation of a touch electrode driving signal, and in particular to a touch electrode driving circuit, a touch electrode driver, and a touch display device.

BACKGROUND

With continuous development of science and technology, various touch electronic devices are more and more widely applied in our work and daily life, bringing great convenience to our work and daily life.

Touch screen is a major part of a touch electronic device, by which the touch electronic device realizes touch operations and image display. A touch electrode driving circuit is an important structure for enabling the touch screen to realize touch driving. However, existing touch electrode driving circuits can only drive touch electrodes one by one to perform touch detection, which results in low efficiency.

SUMMARY

According to an exemplary embodiment, a touch electrode driving circuit is provided, comprising: an input terminal, operable to receive an input pulse; a reset terminal, operable to receive a reset pulse; a first voltage terminal, operable to be applied with a first voltage; a second voltage terminal, operable to be applied with a second voltage; a third voltage terminal, operable to be applied with a third voltage; a fourth voltage terminal, operable to be applied with a fourth voltage; a common voltage signal terminal, operable to be applied with a common voltage signal; a first common voltage signal control terminal, operable to be applied with a first common voltage control signal; a second common voltage signal control terminal, operable to be applied with a second common voltage control signal; a first clock signal terminal, operable to receive a first clock signal; a second clock signal terminal, operable to receive a second clock signal; a third clock signal terminal, operable to receive a third clock signal; a fourth clock signal terminal, operable to receive a fourth clock signal; a touch signal terminal, operable to receive a touch scan signal; a touch control signal terminal, operable to receive a touch control signal; a first output terminal, operable to output a first output signal; a second output terminal, operable to output a second output signal; a third output terminal, operable to output a third output signal; an input circuit, configured to: bring the first voltage terminal into conduction with a first node in response to the input pulse received at the input terminal being active; and bring the second voltage terminal into conduction with the first node in response to the reset pulse received at the reset terminal being active; a first control circuit, configured to: bring the first voltage terminal into conduction with a second node in response to the third clock signal received at the third clock signal terminal being active; and bring the second voltage terminal into conduction with the second node in response to the fourth clock signal received at the fourth clock signal terminal being active; a second control circuit, configured to: bring the fourth voltage terminal into conduction with the first node in response to the second node being at an active potential; a third control circuit, configured to: bring the first clock signal terminal into conduction with a third node in response to the first node being at an active potential; and bring the fourth voltage terminal into conduction with the third node in response to the second node being at an active potential; a fourth control circuit, configured to: bring the second clock signal terminal into conduction with a fourth node in response to the first node being at an active potential; and bring the fourth voltage terminal into conduction with the fourth node in response to the second node being at an active potential; wherein the fourth node is connected with the third output terminal; a fifth control circuit, configured to: bring a fifth node into conduction with the touch control signal terminal in response to the third node being at an active potential; and bring the fourth voltage terminal into conduction with the fifth node in response to the first common voltage control signal received at the first common voltage signal control terminal being active; a sixth control circuit, configured to: bring a sixth node into conduction with the touch control signal terminal in response to the fourth node being at an active potential; and bring the fourth voltage terminal into conduction with the sixth node in response to the second common voltage control signal received at the second common voltage signal control terminal being active; a first output circuit, configured to: bring the first output terminal into conduction with the touch signal terminal in response to the fifth node being at an active potential; and bring the common voltage signal terminal into conduction with the first output terminal in response to the fifth node being at an inactive potential; and a second output circuit, configured to: bring the second output terminal into conduction with the touch signal terminal in response to the sixth node being at an active potential; and bring the common voltage signal terminal into conduction with the second output terminal in response to the sixth node being at an inactive potential.

According to an exemplary embodiment, the input circuit comprises: a first transistor, a gate thereof being connected to the input terminal, a first electrode thereof being connected to the first voltage terminal, and a second electrode thereof being connected to the first node; a second transistor, a gate thereof being connected to the reset terminal, a first electrode thereof being connected to the first node, and a second electrode thereof being connected to the second voltage terminal; and a first capacitor, a first electrode thereof being connected to the first node, and a second electrode thereof being connected to the fourth voltage terminal.

According to an exemplary embodiment, the first control circuit comprises: a third transistor, a gate thereof being connected to the third clock signal terminal, a first electrode thereof being connected to the first voltage terminal; a fourth transistor, a gate thereof being connected to the fourth clock signal terminal, a second electrode thereof being connected to the second voltage terminal; a fifth transistor, a gate thereof being connected to the third voltage terminal, a first electrode thereof being connected to the second node; and wherein a second electrode of the third transistor, a first electrode of the fourth transistor and a second electrode of the fifth transistor are connected together.

According to an exemplary embodiment, the second control circuit comprises a sixth transistor, a gate thereof being connected to the second node, a first electrode thereof being connected to the first node, and a second electrode thereof being connected to the fourth voltage terminal.

According to an exemplary embodiment, the second control circuit further comprises a second capacitor, a first electrode thereof being connected to the second node, and a second electrode thereof being connected to the fourth voltage terminal.

According to an exemplary embodiment, the third control circuit comprises: a seventh transistor, a gate thereof being connected to the third voltage terminal, a second electrode thereof being connected to the first node; a ninth transistor, a first electrode thereof being connected to the first clock signal terminal, a second electrode thereof being connected to the third node; a tenth transistor, a gate thereof being connected to the second node, a first electrode thereof being connected to the third node, and a second electrode thereof being connected to the fourth voltage terminal; a third capacitor, a second electrode thereof being connected to the third node; and wherein a first electrode of the seventh transistor, a gate of the ninth transistor and a first electrode of the third capacitor are connected together.

According to an exemplary embodiment, the third control circuit further comprises an eleventh transistor, a gate thereof being connected to the first node, a first electrode thereof being connected to the second node, and a second electrode thereof being connected to the fourth voltage terminal, wherein the eleventh transistor supplies the fourth voltage at the fourth voltage terminal to the second node in response to the first node being at an active potential.

According to an exemplary embodiment, the fourth control circuit comprises: an eighth transistor, a gate thereof being connected to the third voltage terminal, a second electrode thereof being connected to the first node; a twelfth transistor, a first electrode thereof being connected to the second clock signal terminal, a second electrode thereof being connected to the fourth node; a fourteenth transistor, a gate thereof being connected to the second node, a first electrode thereof being connected to the fourth node, and a second electrode thereof being connected to the fourth voltage terminal; a fourth capacitor, a second electrode thereof being connected to the fourth node; and wherein a first electrode of the eighth transistor, a gate of the twelfth transistor and a first electrode of the fourth capacitor are connected together.

According to an exemplary embodiment, the fourth control circuit further comprises a thirteenth transistor, a gate thereof being connected to the first node, a first electrode thereof being connected to the second node, and a second electrode thereof being connected to the fourth voltage terminal, wherein the thirteenth transistor supplies the fourth voltage at the fourth voltage terminal to the second node in response to the first node being at an active potential.

According to an exemplary embodiment, the fifth control circuit comprises: a fifteenth transistor, a gate thereof being connected to the third node, a first electrode thereof being connected to the touch control signal terminal, and a second electrode thereof being connected to the fifth node; and a sixteenth transistor, a gate thereof being connected to the first common voltage signal control terminal, a first electrode thereof being connected to the fifth node, and a second electrode thereof being connected to the fourth voltage terminal.

According to an exemplary embodiment, the sixth control circuit comprises: a twenty-first transistor, a gate thereof being connected to the fourth node, a first electrode thereof being connected to the touch control signal terminal, and a second electrode thereof being connected to the sixth node; and a twenty-second transistor, a gate thereof being connected to the second common voltage signal control terminal, a first electrode thereof being connected to the sixth node, and a second electrode thereof being connected to the fourth voltage terminal.

According to an exemplary embodiment, the first output circuit comprises: a seventeenth transistor, both a gate thereof and a first electrode thereof being connected to the third voltage terminal; an eighteenth transistor, a gate thereof being connected to the fifth node, a second electrode thereof being connected to the fourth voltage terminal; a nineteenth transistor, a gate thereof being connected to the fifth node, a first electrode thereof being connected to the touch signal terminal, and a second electrode thereof being connected to the first output terminal; a twentieth transistor, a first electrode thereof being connected to the first output terminal, a second electrode thereof being connected to the common voltage signal terminal; and wherein a second electrode of the seventeenth transistor, a first electrode of the eighteenth transistor and a gate of the twentieth transistor are connected together.

According to an exemplary embodiment, the first output circuit further comprises a fifth capacitor, a first electrode thereof being connected to the fifth node, and a second electrode thereof being connected to the first output terminal. According to an embodiment, the first output circuit further comprises a sixth capacitor, a first electrode thereof being connected to the gate of the twentieth transistor, and a second electrode thereof being connected to the fourth voltage terminal.

According to an exemplary embodiment, the second output circuit comprises: a twenty-third transistor, both a gate thereof and a first electrode thereof being connected to the third voltage terminal; a twenty-fourth transistor, a gate thereof being connected to the sixth node, a second electrode thereof being connected to the fourth voltage terminal; a twenty-fifth transistor, a gate thereof being connected to the sixth node, a first electrode thereof being connected to the touch signal terminal, and a second electrode thereof being connected to the second output terminal; a twenty-sixth transistor, a first electrode thereof being connected to the second output terminal, a second electrode thereof being connected to the common voltage signal terminal; and wherein a second electrode of the twenty-third transistor, a first electrode of the twenty-fourth transistor and a gate of the twenty-sixth transistor are connected together.

According to an exemplary embodiment, the second output circuit further comprises a seventh capacitor, a first electrode thereof being connected to the sixth node, and a second electrode thereof being connected to the second output terminal.

According to an exemplary embodiment, the second output circuit further comprises an eighth capacitor, a first electrode thereof being connected to the gate of the twenty-sixth transistor, and a second electrode thereof being connected to the fourth voltage terminal.

According to another exemplary embodiment, a touch electrode driver is provided, comprising: a first voltage line, operable to transfer a first voltage; a second voltage line, operable to transfer a second voltage; a third voltage line, operable to transfer a third voltage; a fourth voltage line, operable to transfer a fourth voltage; a common voltage signal line, operable to be applied with a common voltage signal; a first common voltage signal control line, operable to be applied with a first common voltage control signal; a second common voltage signal control line, operable to be applied with a second common voltage control signal; a first clock line, operable to receive a first clock signal; a second clock line, operable to receive a second clock signal; a third clock line, operable to receive a third clock signal; a fourth clock line, operable to receive a fourth clock signal; a touch signal line, operable to receive a touch scan signal; a touch control signal line, operable to receive a touch control signal; N touch electrode driving circuits as described above and connected in cascade, N being an integer greater than or equal to 2, wherein a third output terminal of the m-th touch electrode driving circuit in the N touch electrode driving circuits is connected to an input terminal of the (m+1)-th touch electrode driving circuit in the N touch electrode driving circuits, m being an integer and 1≤m<N, and wherein a third output terminal of the n-th touch electrode driving circuit in the N touch electrode driving circuits is connected to a reset terminal of the (n−1)-th touch electrode driving circuit in the N touch electrode driving circuits, n being an integer and 1<n≤N, wherein each of first voltage terminals of the N touch electrode driving circuits is connected to the first voltage line; each of second voltage terminals of the N touch electrode driving circuits is connected to the second voltage line; each of third voltage terminals of the N touch electrode driving circuits is connected to the third voltage line; each of fourth voltage terminals of the N touch electrode driving circuits is connected to the fourth voltage line; each of common voltage signal terminals of the N touch electrode driving circuits is connected to the common voltage signal line; each of first common voltage signal control terminals of the N touch electrode driving circuits is connected to the first common voltage signal control line; each of second common voltage signal control terminals of the N touch electrode driving circuits is connected to the second common voltage signal control line; each of touch signal terminals of the N touch electrode driving circuits is connected to the touch signal line; each of touch control signal terminals of the N touch electrode driving circuits is connected to the touch control signal line; a first clock signal terminal of the (2k−1)-th touch electrode driving circuit in the N touch electrode driving circuits is connected to the first clock line, a second clock signal terminal thereof is connected to the second clock line, a third clock signal terminal thereof is connected to the third clock line, and a fourth clock signal terminal thereof is connected to the fourth clock line; a first clock signal terminal of the (2k)-th touch electrode driving circuit in the N touch electrode driving circuits is connected to the third clock line, a second clock signal terminal thereof is connected to the fourth clock line, a third clock signal terminal thereof is connected to the first clock line, and a fourth clock signal terminal thereof is connected to the second clock line; wherein k is a positive integer and 2k≤N.

According to yet another exemplary embodiment, a touch display device is provided, comprising: the above touch electrode driver; a timing sequence controller, configured to: supply the first clock signal, the second clock signal, the third clock signal and the fourth clock signal to the first clock line, the second clock line, the third clock line and the fourth clock line respectively, and provide the first common voltage control signal to the first common voltage signal control line, provide the second common voltage control signal to the second common voltage signal control line, provide the touch control signal to the touch control signal line, and provide the touch scan signal to the touch signal line; a voltage generator, configured to at least supply the first voltage, the second voltage, the third voltage, the fourth voltage and the common voltage signal to the first voltage line, the second voltage line, the third voltage line, the fourth voltage line and the common voltage signal line respectively; and a touch display panel, configured to display received image data and sense touch operations of the user.

In light of the exemplary embodiments described below, these and other aspects of the disclosure will be clear and clarified with reference to the exemplary embodiments described below.

BRIEF DESCRIPTION OF DRAWINGS

Specific embodiments will be described in detail with reference to the drawings so as to give better knowledge and understanding of the problem to be solved, the above and further objectives, features and advantages of the disclosure, in the drawings.

DETAILED DESCRIPTION OF EMBODIMENTS

The specific implementations of the touch electrode driving circuit and the driving method thereof, the touch electrode driver and the touch display device according to the exemplary embodiments will be explained in detail with reference to the drawings.

It will be understood that although terms such as "first", "second" and "third" can be used to describe various elements, components and/or parts herein, these elements, components and/or parts should not be limited by these terms. Instead, these terms are only used to distinguish one element, component or part from another element, component or part. Therefore, a first element, component or part discussed below can be referred to as a second or third element, component or part without deviating from the teaching of the disclosure.

Terms used herein are only intended for describing a specified exemplary embodiment, rather than limiting the disclosure. As used herein, singular forms like "a", "an" and "the" are also intended to include plural forms, unless explicitly indicated otherwise in the context. It should also be understood that when used in this description, the term "include" and/or "comprise" refers to the presence of stated features, entities, steps, operations, elements and/or components, but does not exclude the presence of one or more other features, entities, steps, operations, elements, components and/or a group thereof or the addition of one or more other features, entities, steps, operations, elements, components and/or a group thereof. As used herein, the term "and/or" comprises any and all combinations of one or more of listed items associated therewith.

It will be understood that when an element is described as "being connected to another element" or "being coupled to another element", it can be connected or coupled to another element directly, or there may be an intermediate element. On the contrary, when an element is described as "being directly connected to another element" or "being directly coupled to another element", there is no intermediate element.

Unless otherwise defined, all terms used herein (including both technical terms and scientific terms) have the same meanings as commonly understood by one having ordinary skills in the art to which the disclosure pertains. It should also be understood that terms such as those defined in a common dictionary should be construed as having meanings consistent with their meanings in the related art and/or in the context of this description, and they will not be construed in an ideal or overly formal sense, unless explicitly so defined herein.

For clarity, some techniques, structures and materials commonly known in the art to which the disclosure pertains are not described in detail to avoid redundancy of the present application.

Figure 1:
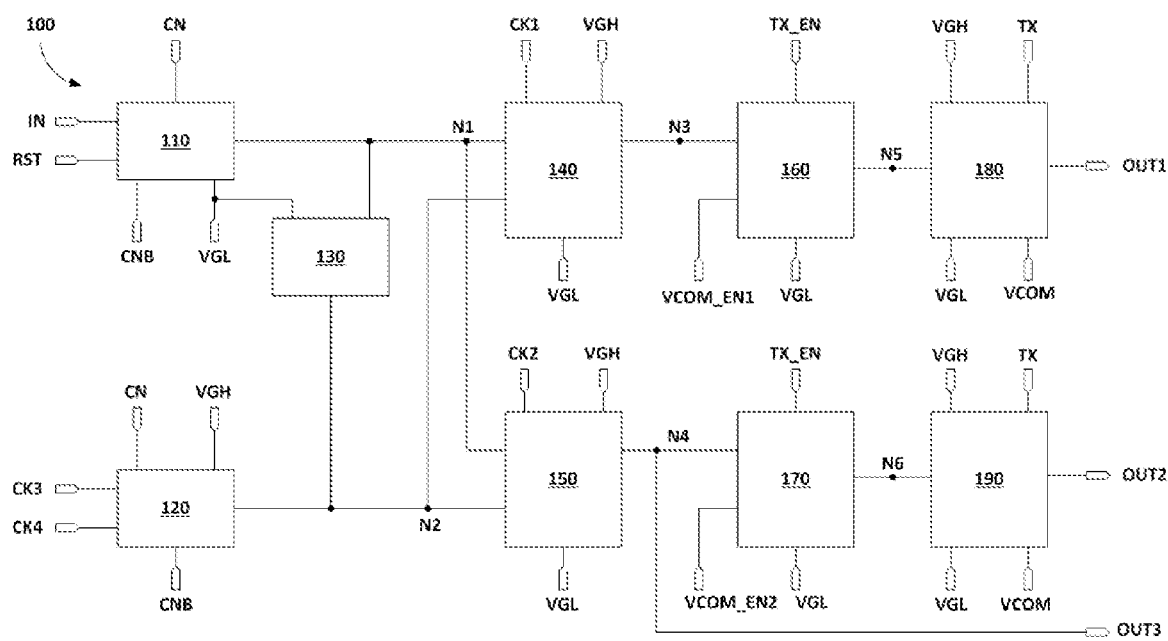
FIG. 1 is an exemplary block diagram of a touch electrode driving circuit according to an exemplary embodiment.

FIG. 1 is an exemplary block diagram of a touch electrode driving circuit according to an exemplary embodiment. Referring to FIG. 1, touch electrode driving circuit 100 comprises: an input terminal IN operable to receive an input pulse; a reset terminal RST operable to receive a reset pulse; a first voltage terminal CN operable to be applied with a first voltage; a second voltage terminal CNB operable to be applied with a second voltage; a third voltage terminal VGH operable to be applied with a third voltage; a fourth voltage terminal VGL operable to be applied with a fourth voltage; a common voltage signal terminal VCOM operable to be applied with a common voltage signal; a first common voltage signal control terminal VCOM_EN1 operable to be applied with a first common voltage control signal; a second common voltage signal control terminal VCOM_EN2 operable to be applied with a second common voltage control signal; a first clock signal terminal CK1 operable to receive a first clock signal; a second clock signal terminal CK2 operable to receive a second clock signal; a third clock signal terminal CK3 operable to receive a third clock signal; a fourth clock signal terminal CK4 operable to receive a fourth clock signal; a touch signal terminal TX operable to receive a touch scan signal; a touch control signal terminal TX_EN operable to receive a touch control signal; a first output terminal OUT1 operable to output a first output signal; a second output terminal OUT2 operable to output a second output signal; a third output terminal OUT3 operable to output a third output signal. The touch electrode driving circuit 100 further comprises an input circuit 110, a first control circuit 120, a second control circuit 130, a third control circuit 140, a fourth control circuit 150, a fifth control circuit 160, a sixth control circuit 170, a first output circuit 180 and a second output circuit 190, which are illustrated as blocks.

The input circuit 110 is configured to: bring the first voltage terminal CN into conduction with a first node N1 in response to the input pulse received at the input terminal IN being active, thereby supplying the first voltage to the first node N1. The input circuit 110 is further configured to: bring the second voltage terminal CNB into conduction with the first node N1 in response to the reset pulse received at the reset terminal RST being active, thereby supplying the second voltage to the first node N1.

The first control circuit 120 is configured to: bring the first voltage terminal CN into conduction with a second node N2 in response to the third clock signal, received at the third clock signal terminal CK3, being active, thereby supplying the first voltage to the second node N2; and bring the second voltage terminal CNB into conduction with the second node N2 in response to the fourth clock signal, received at the fourth clock signal terminal CK4, being active, thereby supplying the second voltage to the second node N2.

The second control circuit 130 is configured to: bring the fourth voltage terminal VGL into conduction with the first node N1 in response to the second node N2 being at an active potential, such that the first node N1 is at an inactive potential.

The third control circuit 140 is configured to: bring the first clock signal terminal CK1 into conduction with a third node in response to the first node N1 being at an active potential; and bring the fourth voltage terminal VGL into conduction with the third node N3 in response to the second node N2 being at an active potential.

The fourth control circuit 150 is configured to: bring the second clock signal terminal CK2 into conduction with a fourth node N4 in response to the first node N1 being at an active potential; and bring the fourth voltage terminal VGL into conduction with the fourth node N4 in response to the second node N2 being at an active potential. Besides, the fourth node N4 is connected with the third output terminal OUT3 such that the signal at the fourth node N4 is used as a third output signal. The third output signal can be used as an input signal of the next stage touch electrode driving circuit, and/or as a reset signal of the previous stage touch electrode driving circuit.

The fifth control circuit 160 is configured to: bring a fifth node N5 into conduction with the touch control signal terminal TX_EN in response to the third node N3 being at an active potential, thereby supplying the touch control signal to the fifth node N5; and bring the fourth voltage terminal VGL into conduction with the fifth node N5 in response to the first common voltage control signal received at the first common voltage signal control terminal VCOM_EN1 being active.

The sixth control circuit 170 configured to: bring a sixth node N6 into conduction with the touch control signal terminal TX_EN in response to the fourth node N4 being at an active potential, thereby supplying the touch control signal to the sixth node N6; and bring the fourth voltage terminal VGL into conduction with the sixth node N6 in response to the second common voltage control signal received at the second common voltage signal control terminal VCOM_EN2 being active.

The first output circuit 180 is configured to: bring the first output terminal OUT1 into conduction with the touch signal terminal TX in response to the fifth node N5 being at an active potential; and bring the common voltage signal terminal VCOM into conduction with the first output terminal OUT1 in response to the fifth node N5 being at an inactive potential.

The second output circuit 190 is configured to: bring the second output terminal OUT2 into conduction with the touch signal terminal TX in response to the sixth node N6 being at an active potential; and bring the common voltage signal terminal VCOM into conduction with the second output terminal OUT2 in response to the sixth node N6 being at an inactive potential.

The term "active potential" used herein refers to the potential required for enabling a circuit element involved (e.g., a transistor), and the term "inactive potential" used herein refers to the potential at which the involved circuit element is disabled. For an n-type transistor, the active potential is a high potential, and the inactive potential is a low potential. For a p-type transistor, the active potential is a low potential, and the inactive potential is a high potential.

It will be understood that the active potential or the inactive potential is not intended to refer to a specific potential, but instead it may comprise a potential range. Besides, the terms "voltage" and "level" can be used interchangeably with "potential".

It is easily understandable that in this exemplary embodiment, one and the same touch electrode driving circuit can output touch scan signals to two touch electrodes through cooperative interaction between the above circuits. Such arrangement not only improves the driving efficiency of the touch electrode driving circuit, but also reduces power consumption.

Figure 2:
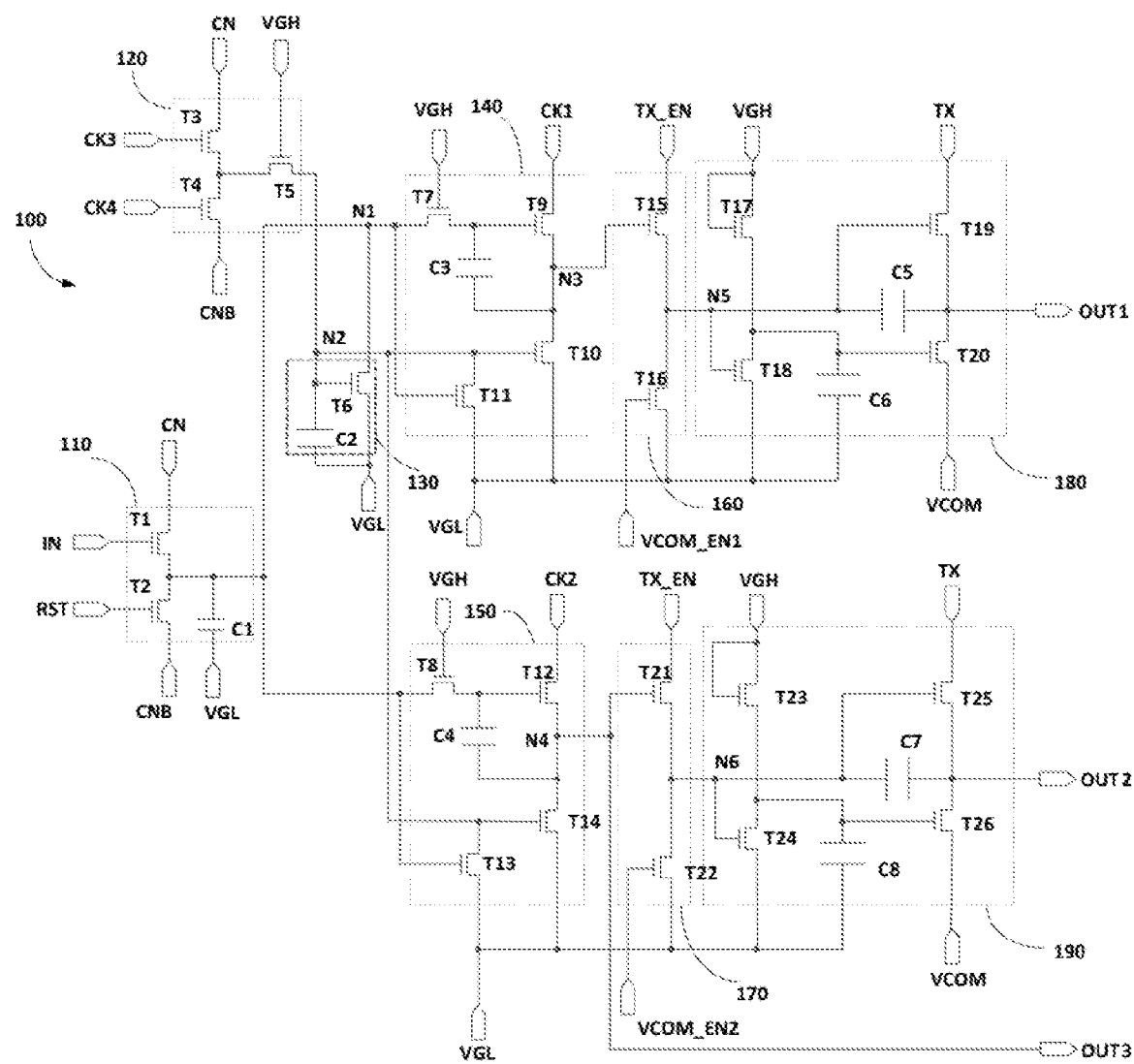
FIG. 2 is a circuit diagram of an exemplary circuit of the touch electrode driving circuit of FIG. 1.

FIG. 2 is a circuit diagram of an exemplary circuit of the touch electrode driving circuit 100 of FIG. 1. An exemplary structure of the touch electrode driving circuit 100 will be described with reference to FIG. 2. It should be pointed out that in the exemplary embodiment shown in FIG. 2, although the transistors are shown and described as n-type transistors, they may also be p-type transistors. In the case of p-type transistors, the gate on voltage has a low level, and the gate off voltage has a high level. In the exemplary embodiments of the disclosure, the transistors may be in the form of thin film transistors (TFT) and typically fabricated such that their first and second electrodes can be used interchangeably. In some exemplary embodiments, the transistors may also be, for example, metal oxide semiconductor (MOS) field effect transistors (FET) with their control electrodes as their gates, and depending on different transistor types and different input signals, their first and second electrodes can be used interchangeably. In other words, the first electrode can be used as the source and the second electrode as the drain, or the first electrode can be used as the drain and the second electrode as the source. Besides, other embodiments can also be conceived without contradicting the teachings of the disclosure.

As shown in FIG. 2, the input circuit 110 comprises a first transistor T1, a second transistor T2 and a first capacitor C1. The first transistor T1 has a gate connected to the input terminal IN, a first electrode connected to the first voltage terminal CN, and a second electrode connected to the first node N1. A gate of the second transistor T2 is connected to the reset terminal RST, a first electrode thereof is connected to the first node N1, and a second electrode thereof is connected to the second voltage terminal CNB. A first electrode of the first capacitor C1 is connected to the first node N1, and a second electrode thereof is connected to the fourth voltage terminal VGL. The first capacitor C1 is used for filtering the noise at the first node N1 and keeping the voltage at the first node N1 stable. It is easily understandable that the input signal at the input terminal IN and the reset signal at the reset terminal RST will not be active at the same time.

The first control circuit 120 comprises a third transistor T3, a fourth transistor T4 and a fifth transistor T5. A gate of the third transistor T3 is connected to the third clock signal terminal CK3, and a first electrode thereof is connected to the first voltage terminal CN. A gate of the fourth transistor T4 is connected to the fourth clock signal terminal CK4, and a second electrode thereof is connected to the second voltage terminal CNB. A gate of the fifth transistor T5 is connected to the third voltage terminal VGH, and a first electrode thereof is connected to the second node N2. A second electrode of the third transistor T3, a first electrode of the fourth transistor T4 and a second electrode of the fifth transistor T5 are connected together. The voltage at the third voltage terminal VGH keeps the voltage signal at the gate of the fifth transistor T5 at an active potential, so the fifth transistor T5 is in a normally-on state such that the first electrode and the second electrode thereof are always in conduction. Therefore, the fifth transistor T5 works as a single transistor transfer gate, which can better reduce the noise in the voltage signal.

The second control circuit 130 comprises a sixth transistor T6, a gate thereof being connected to the second node N2, a first electrode thereof being connected to the first node N1, and a second electrode thereof being connected to the fourth voltage terminal VGL. The second control circuit 130 may further comprise a second capacitor C2, a first electrode thereof being connected to the second node N2, and a second electrode thereof being connected to the fourth voltage terminal VGL. The second capacitor C2 can help to maintain the stability of the voltage at the gate of the sixth transistor T6 so as to ensure that it remains switched on. Besides, the second capacitor C2 can further filter the noise in the voltage signal at the gate of the sixth transistor T6. In some other exemplary embodiments, the second capacitor C2 may be omitted.

The third control circuit 140 comprises a seventh transistor T7, a ninth transistor T9, a tenth transistor T10 and a third capacitor C3. A gate of the seventh transistor T7 is connected to the third voltage terminal VGH, and a second electrode thereof is connected to the first node N1. A first electrode of the ninth transistor T9 is connected to the first clock signal terminal CK1, and a second electrode thereof is connected to the third node N3. A gate of the tenth transistor T10 is connected to the second node N2, a first electrode thereof is connected to the third node N3, and a second electrode thereof is connected to the fourth voltage terminal VGL. A second electrode of the third capacitor C3 is connected to the third node N3. Besides, a first electrode of the seventh transistor T7, a gate of the ninth transistor T9 and a first electrode of the third capacitor C3 are connected together. The voltage at the third voltage terminal VGH keeps the voltage signal at the gate of the seventh transistor T7 at an active potential, so the seventh transistor T7 is in a normally-on state such that the first electrode and the second electrode thereof are always in conduction. Therefore, the seventh transistor T7 also works as a single transistor transfer gate. The third capacitor C3 can help to maintain the stability of the voltage at the gate of the ninth transistor T9 so as to ensure that it remains switched on.

The third control circuit 140 may further comprise an eleventh transistor T11, a gate thereof being connected to the first node N1, a first electrode thereof being connected to the second node N2, and a second electrode thereof being connected to the fourth voltage terminal VGL. The eleventh transistor T11 is switched on when its gate (i.e., the first node N1) is at an active potential so as to supply the fourth voltage to the second node N2, such that the second node N2 is at an inactive potential. In some other exemplary embodiments, the eleventh transistor T11 may be omitted.

The fourth control circuit 150 comprises an eighth transistor T8, a twelfth transistor T12, a fourteenth transistor T14 and a fourth capacitor C4. A gate of the eighth transistor T8 is connected to the third voltage terminal VGH, and a second electrode thereof is connected to the first node N1. A first electrode of the twelfth transistor T12 is connected to the second clock signal terminal CK2, and a second electrode thereof is connected to the fourth node N4. A gate of the fourteenth transistor T14 is connected to the second node N2, a first electrode thereof is connected to the fourth node N4, and a second electrode thereof is connected to the fourth voltage terminal VGL. A second electrode of the fourth capacitor C4 is connected to the fourth node N4. Besides, a first electrode of the eighth transistor T8, a gate of the twelfth transistor T12 and a first electrode of the fourth capacitor C4 are connected together. The voltage at the third voltage terminal VGH keeps the gate of the eighth transistor T8 at an active potential, so the eighth transistor T8 is in a normally-on state such that the first electrode and the second electrode thereof are always in conduction. Therefore, the eighth transistor T8 also works as a single transistor transfer gate. The fourth capacitor C4 can help to maintain the stability of the voltage at the gate of the twelfth transistor T12 so as to ensure that it remains switched on.

The fourth control circuit 150 may further comprise a thirteenth transistor T13, a gate thereof being connected to the first node N1, a first electrode thereof being connected to the second node N2, and a second electrode thereof being connected to the fourth voltage terminal VGL. The thirteenth transistor T13 is switched on when its gate (i.e., the first node N1) is at an active potential so as to supply the fourth voltage to the second node N2, such that the second node N2 is at an inactive potential. In some other exemplary embodiments, the thirteenth transistor T13 may be omitted.

It is easily understandable that specific circuit structure making the second node N2 at an inactive potential in response to the first node N1 being at an active potential is not limited to the above circuit structures (e.g., the eleventh transistor T11 and the thirteenth transistor T13) provided in the exemplary embodiments, but instead it may also be any other circuit structure conceivable for those skilled in the art.

Besides, the fourth node N4 is further connected with the third output terminal OUT3 such that the signal at the fourth node N4 can be outputted as a third output signal. The third output signal can be used as an input signal of the next stage touch electrode driving circuit, and/or as a reset signal of the previous stage touch electrode driving circuit.

The fifth control circuit 160 comprises a fifteenth transistor T15 and a sixteenth transistor T16. A gate of the fifteenth transistor T15 is connected to the third node N3, a first electrode thereof is connected to the touch control signal terminal TX_EN, and a second electrode thereof is connected to the fifth node N5. A gate of the sixteenth transistor T16 is connected to the first common voltage signal control terminal VCOM_EN1, a first electrode thereof is connected to the fifth node N5, and a second electrode thereof is connected to the fourth voltage terminal VGL.

The sixth control circuit 170 comprises a twenty-first transistor T21 and a twenty-second transistor T22. A gate of the twenty-first transistor T21 is connected to the fourth node N4, a first electrode thereof is connected to the touch control signal terminal TX_EN, and a second electrode thereof is connected to the sixth node N6. A gate of the twenty-second transistor T22 is connected to the second common voltage signal control terminal VCOM_EN2, a first electrode thereof is connected to the sixth node N6, and a second electrode thereof is connected to the fourth voltage terminal VGL.

The first output circuit 180 comprises a seventeenth transistor T17, an eighteenth transistor T18, a nineteenth transistor T19 and a twentieth transistor T20. Both a gate and a first electrode of the seventeenth transistor T17 are connected to the third voltage terminal VGH. A gate of the eighteenth transistor T18 is connected to the fifth node N5, and a second electrode thereof is connected to the fourth voltage terminal VGL. A gate of the nineteenth transistor T19 is connected to the fifth node N5, a first electrode thereof is connected to the touch signal terminal TX, and a second electrode thereof is connected to the first output terminal OUT1. A first electrode of the twentieth transistor T20 is connected to the first output terminal OUT1, and a second electrode thereof is connected to the common voltage signal terminal VCOM. Besides, a second electrode of the seventeenth transistor T17, a first electrode of the eighteenth transistor T18 and a gate of the twentieth transistor T20 are connected together.

The first output circuit 180 may further comprise a fifth capacitor C5, a first electrode thereof being connected to the fifth node N5, and a second electrode thereof being connected to the first output terminal OUT1. The presence of the fifth capacitor C5 is advantageous, because the potential at the fifth node N5 can be further raised by means of the bootstrap effect of the fifth capacitor C5 such that the nineteenth transistor T19 is further switched on. In some other exemplary embodiments, the fifth capacitor C5 may be omitted. The first output circuit 180 may further comprise a sixth capacitor C6, a first electrode thereof being connected to the gate of the twentieth transistor T20, and a second electrode thereof being connected to the fourth voltage terminal VGL. The sixth capacitor C6 can filter the noise in the voltage signal at the gate of the twentieth transistor T20. In some other exemplary embodiments, the sixth capacitor C6 may be omitted.

The second output circuit 190 comprises a twenty-third transistor T23, a twenty-fourth transistor T24, a twenty-fifth transistor T25 and a twenty-sixth transistor T26. Both a gate and a first electrode of the twenty-third transistor T23 are connected to the third voltage terminal VGH. A gate of the twenty-fourth transistor T24 is connected to the sixth node N6, and a second electrode thereof is connected to the fourth voltage terminal VGL. A gate of the twenty-fifth transistor T25 is connected to the sixth node N6, a first electrode thereof is connected to the touch signal terminal TX, and a second electrode thereof is connected to the second output terminal OUT2. A first electrode of the twenty-sixth transistor T26 is connected to the second output terminal OUT2, and a second electrode thereof is connected to the common voltage signal terminal VCOM. Besides, a second electrode of the twenty-third transistor T23, a first electrode of the twenty-fourth transistor T24 and a gate of the twenty-sixth transistor T26 are connected together.

The second output circuit 190 may further comprise a seventh capacitor C7, a first electrode thereof being connected to the sixth node N6, and a second electrode thereof being connected to the second output terminal OUT2. The presence of the seventh capacitor C7 is advantageous, because the potential at the sixth node N6 can be further raised by means of the bootstrap effect of the seventh capacitor C7 such that the twenty-fifth transistor T25 is further switched on. In some other exemplary embodiments, the seventh capacitor C7 may be omitted. The second output circuit 190 may further comprise an eighth capacitor C8, a first electrode thereof being connected to the gate of the twenty-sixth transistor T26, and a second electrode thereof being connected to the fourth voltage terminal VGL. The eighth capacitor C8 can filter the noise in the voltage signal at the gate of the twenty-sixth transistor T26. In some other exemplary embodiments, the eighth capacitor C8 may be omitted.

Figure 3:
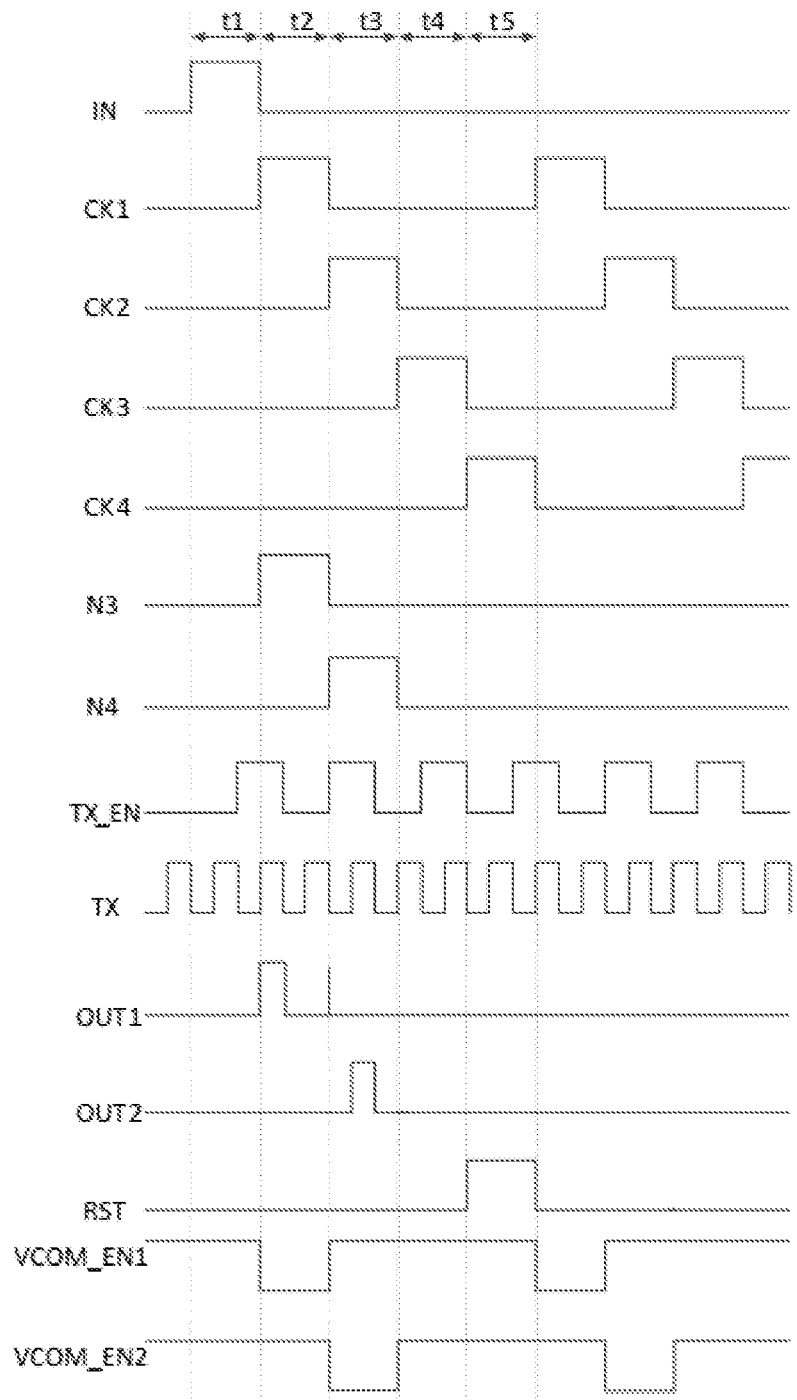
FIG. 3 is an exemplary timing sequence diagram of the touch electrode driving circuit of FIG. 2.

FIG. 3 is an exemplary timing sequence diagram of the touch electrode driving circuit 100 of FIG. 2, and the operation of the exemplary circuit of FIG. 2 will be described hereinafter with reference to FIG. 3. In the discussion herein, a "1" represents a high level, and a "0" represents a low level, but they do not represent specific potentials. Referring to FIG. 2 and FIG. 3, the operation of the touch electrode driving circuit 100 comprises five stages, namely t1 to t5, wherein all transistors are n-type transistors, and signals of CN and VGH signal terminals are both at high level, and signals of CNB, VGL and VCOM signal terminals are all at low level. Signals of the touch control signal terminal TX_EN are square wave pulse signals for sampling signals of the touch signal terminal TX, and the signals of the touch signal terminal TX are a group of high frequency pulse signals for detecting and scanning touch signals. A pulse signal of the touch control signal terminal TX_EN can correspond to a plurality of pulse signals of the touch signal terminal TX.

In stage t1, IN=1, RST=0, CK1=0, CK2=0, CK3=0, CK4=0, VCOM_EN1=1, VCOM_EN2=1.

Since IN=1, the first transistor T1 is switched on to provide the high level signal of the first voltage terminal CN to the first node N1 such that the first node N1 is set at an active potential, and meanwhile to charge the first capacitor C1. The seventh transistor T7 and the eighth transistor T8 are normally-on to provide the high level signal of the first node N1 to the gate of the ninth transistor T9 and the gate of the twelfth transistor T12, and to charge the third capacitor C3 and the fourth capacitor C4. Since the first node N1 is at an active potential, the ninth transistor T9, the twelfth transistor T12, the eleventh transistor T11 and the thirteenth transistor T13 are switched on. The voltage at the second node N2 is pulled down by the switching-on of the eleventh transistor T11 and the thirteenth transistor T13, such that the second node N2 is at an inactive potential. The first clock signal terminal CK1 and the third node N3 are in conduction by the switching-on of the ninth transistor T9, and the second clock signal terminal CK2 and the fourth node N4 are in conduction by the switching-on of the twelfth transistor T12. Since CK1=0 and CK2=0, both the third node N3 and the fourth node N4 are at low level, i.e., they are at an inactive potential. Since the third node N3 and the fourth node N4 are at an inactive potential, the fifteenth transistor T15 and the twenty-first transistor T21 are switched off VCOM_EN1=1 and VCOM_EN2=1, so the sixteenth transistor T16 and the twenty-second transistor T22 are switched on to provide the low voltage signal of the fourth voltage terminal VGL to the fifth node N5 and the sixth node N6, ensuring that the fifth node N5 and the sixth node N6 are set at an inactive potential. Since the fifth node N5 and the sixth node N6 are at an inactive potential, the eighteenth transistor T18, the nineteenth transistor T19, the twenty-fourth transistor T24 and the twenty-fifth transistor T25 are all switched off. The seventeenth transistor T17 provides the high level signal of the third voltage terminal VGH to the gate of the twentieth transistor T20 such that the twentieth transistor T20 is switched on, thereby providing the signal of the common voltage signal terminal VCOM to the first signal output terminal OUT1. By the same token, the twenty-third transistor T23 provides the high level signal of the third voltage terminal VGH to the gate of the twenty-sixth transistor T26 such that the twenty-sixth transistor T26 is switched on, thereby providing the signal of the common voltage signal terminal VCOM to the second signal output terminal OUT2. In other words, in this stage, both the first signal output terminal OUT1 and the second signal output terminal OUT2 output the signal of the common voltage signal terminal VCOM.

In stage t2, IN=0, RST=0, CK1=1, CK2=0, CK3=0, CK4=0, VCOM_EN1=0, VCOM_EN2=1.

Since the first capacitor C1, the third capacitor C3 and the fourth capacitor C4 have already been charged, the first node N1 remains at an active potential, thereby keeping the ninth transistor T9 and the twelfth transistor T12 switched on. The twelfth transistor T12 switched on provides the signal of the second clock signal terminal CK2 to the fourth node N4, and since CK2=0, the fourth node N4 remains at a low level such that the second signal output terminal OUT2 continuously outputs the signal of the common voltage signal terminal VCOM. The ninth transistor T9 switched on provides the signal of the first clock signal terminal CK1 to the third node N3, and since CK1=1, the third node N3 is at a high level (i.e., at an active potential). VCOM_EN1=0, so the sixteenth transistor T16 is now switched off Since the third node N3 is at an active potential, the fifteenth transistor T15 is switched on, thereby providing the touch control signal of the touch control signal terminal TX_EN to the fifth node N5. When the touch control signal is active, rendering the fifth node N5 at an active potential, the nineteenth transistor T19 is switched on, thereby providing the touch signal of the touch signal terminal TX to the first signal output terminal OUT1. The seventeenth transistor T17 and the eighteenth transistor T18 are designed to have such an width-to-length ratio (which determines the equivalent conduction resistance of the transistor) that when both the seventeenth transistor T17 and the eighteenth transistor T18 are switched on, the fifth node N5 is set at an inactive potential, thereby switching off the twentieth transistor T20. In other words, in this stage, the first signal output terminal OUT1 outputs the signal of the touch signal terminal TX, and the second signal output terminal OUT2 outputs the signal of the common voltage signal terminal VCOM.

In stage t3, IN=0, RST=0, CK1=0, CK2=1, CK3=0, CK4=0, VCOM_EN1=1, VCOM_EN2=0.

Since the first capacitor C1, the third capacitor C3 and the fourth capacitor C4 have already been charged, the first node N1 remains at an active potential, and the ninth transistor T9 and the twelfth transistor T12 remain switched on. The ninth transistor T9 switched on provides the signal of the first clock signal terminal CK1 to the third node N3, and since CK1=0, the third node N3 is at a low level such that the first signal output terminal OUT1 outputs the signal of the common voltage signal terminal VCOM again. The twelfth transistor T12 switched on provides the signal of the second clock signal terminal CK2 to the fourth node N4, and since CK2=1, the fourth node N4 is at a high level (i.e., at an active potential). VCOM_EN2=0, so the twenty-second transistor T22 is now switched off Since the fourth node N4 is at an active potential, the twenty-first transistor T21 is switched on, thereby providing the touch control signal of the touch control signal terminal TX_EN to the sixth node N6. When the touch control signal is active, rendering the sixth node N6 at an active potential, the twenty-fifth transistor T25 is switched on, thereby providing the touch signal of the touch signal terminal TX to the second signal output terminal OUT2. The twenty-third transistor T23 and the twenty-fourth transistor T24 are designed to have such an width-to-length ratio (which determines the equivalent conduction resistance of the transistor) that when both the twenty-third transistor T23 and the twenty-fourth transistor T24 are switched on, the sixth node N6 is set at an inactive potential, thereby switching off the twenty-sixth transistor T26. In other words, in this stage, the first signal output terminal OUT1 outputs the signal of the common voltage signal terminal VCOM, and the second signal output terminal OUT2 outputs the touch signal of the touch signal terminal TX.

In stage t4, IN=0, RST=0, CK1=0, CK2=0, CK3=1, CK4=0, VCOM_EN1=1, VCOM_EN2=1.

In this stage, the signal of the third clock signal terminal CK3 is at a high level, and the first clock signal terminal CK1, the second clock signal terminal CK2 and the third clock signal terminal CK3 are all at low level, so the third transistor T3 and the sixth transistor T6 are switched on, and the potential of the first node is pulled down, the first node N1 is thus at an inactive potential, and meanwhile the first capacitor C1, the third capacitor C3 and the fourth capacitor C4 are discharged such that the ninth transistor T9 and the twelfth transistor T12 are switched off Since CK3=1, the potential of the second node N2 is pulled up, and the second node N2 is thus at an active potential, and the tenth transistor T10 and the fourteenth transistor T14 are switched on, thereby pulling down the potentials of the third node N3 and the fourth node N4 such that the fifteenth transistor T15 and the twenty-first transistor T21 are switched off VCOM_EN1=1 and VCOM_EN2=1, so the sixteenth transistor T16 and the twenty-second transistor T22 are switched on to provide the low voltage signal of the fourth voltage terminal VGL to the fifth node N5 and the sixth node N6, such that the fifth node N5 and the sixth node N6 are set at a low level (i.e., at an inactive potential). Since the fifth node N5 and the sixth node N6 are at an inactive potential, the fifth capacitor C5 and the seventh capacitor C7 are discharged, and the eighteenth transistor T18, the nineteenth transistor T19, the twenty-fourth transistor T24 and the twenty-fifth transistor T25 are all switched off. Therefore, both the first signal output terminal OUT1 and the second signal output terminal OUT2 output the signal of the common voltage signal terminal VCOM.

In stage t5, IN=0, RST=1, CK1=0, CK2=0, CK3=0, CK4=1, VCOM_EN1=1, VCOM_EN2=1.

In this stage, since CK3=0 and CK4=1, the third transistor T3 is switched off and the fourth transistor T4 is switched on such that the second voltage terminal CNB is in conduction with the second node N2, thereby discharging the second capacitor C2 and pulling down the potential of the second node N2, rending it at an inactive potential. Besides, in this stage, the reset terminal RST is also at a high level, switching on the second transistor T2 such that the second voltage terminal CNB is in conduction with the first node N1, thereby discharging the first capacitor C1, the third capacitor C3 and the fourth capacitor C4 and pulling down the potential of the first node N1, rending it at an inactive potential. In this way, the touch electrode driving circuit 100 is reset.

As can be known from the working procedure of the above five stages, the touch scan signals can be outputted to two touch electrodes by using one touch electrode driving circuit 100, which not only improves the touch driving efficiency, but also reduces power consumption.

Figure 4:
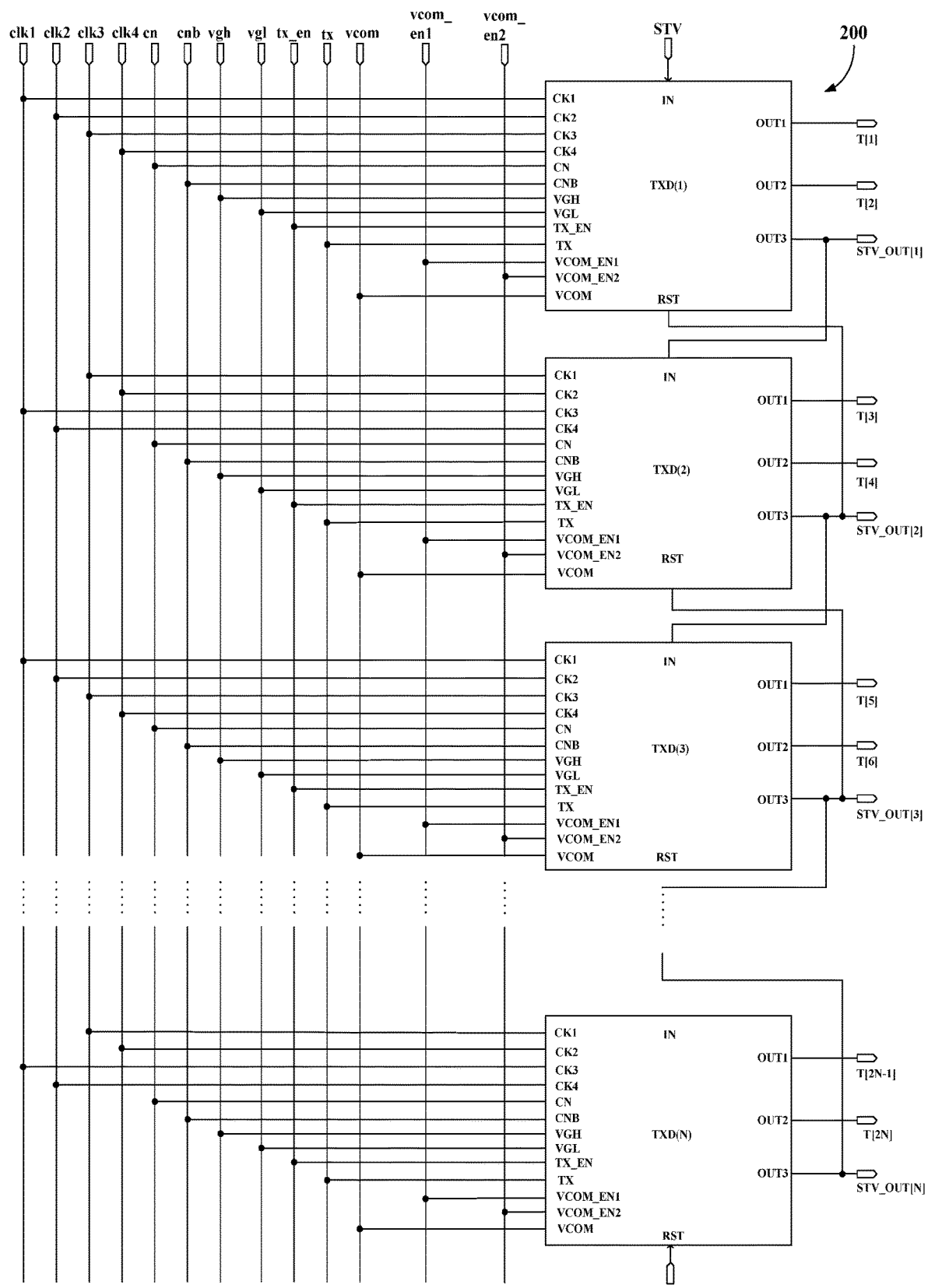
FIG. 4 is an exemplary block diagram of a touch electrode driver based on the touch electrode driving circuit of FIG. 1 and FIG. 2.

FIG. 4 is a block diagram of a touch electrode driver 200 based on the touch electrode driving circuit 100 of FIG. 1 and FIG. 2. As shown in FIG. 4, the touch electrode driver 200 comprises N touch electrode driving circuits TXD(1), TXD(2), . . . , TXD(N-1) and TXD(N) connected in cascade, each of which can be in the form of the touch electrode driving circuit 100 shown in FIG. 1 and FIG. 2. N may be an integer greater than or equal to 2. In the touch electrode driver 200, apart from the first touch electrode driving circuit TXD(1), the input terminal IN of each of the touch electrode driving circuits is connected to the third output terminal OUT3 of a previous touch electrode driving circuit adjacent thereto, and apart from the N-th touch electrode driving circuit TXD(N), the reset terminal RST of each of the touch electrode driving circuits is connected to the third output terminal OUT3 of a next touch electrode driving circuit adjacent thereto.

As shown in FIG. 4, each touch electrode driving circuit of the touch electrode driver 200 outputs two touch electrode scan signals, so each touch electrode driving circuit is connected to two touch electrodes. Therefore, the N touch electrode driving circuits TXD(1), TXD(2), . . . , TXD(N-1) and TXD(N) in the touch electrode driver 200 can be connected to 2N touch electrodes T[1], T[2], . . . , T[2N-1] and T[2N] respectively. Each of the touch electrode driving circuits may be further connected to a first voltage line cn operable to transfer a first voltage, a second voltage line cnb operable to transfer a second voltage, a third voltage line vgh operable to transfer a third voltage, a fourth voltage line vgl operable to transfer a fourth voltage, a touch control signal line tx_en operable to transfer a touch control signal, a touch signal line tx operable to transfer a touch signal, a common voltage signal line vcom operable to transfer a common voltage signal, a first common voltage control signal line vcom_en1 operable to transfer a first common voltage control signal and a second common voltage control signal line vcom_en2 operable to transfer a second common voltage control signal. Each of the touch electrode driving circuits may be further connected to a first clock line clk1 operable to receive a first clock signal, a second clock line clk2 operable to receive a second clock signal, a third clock line clk3 operable to receive a third clock signal and a fourth clock line clk4 operable to receive a fourth clock signal. The first, the second, the third and the fourth clock signals have the same clock cycle and a duty cycle of 25%, and the first, the second, the third and the fourth clock signal pulses are sequentially shifted as shown in the timing sequence diagram of FIG. 3. In particular, the first clock terminal CK1 of the (2k-1)-th touch electrode driving circuit in the touch electrode driving circuits TXD(1), TXD(2), . . . , TXD(N-1) and TXD(N) is connected to the first clock line clk1, the second clock terminal CK2 is connected to the second clock line clk2, the third clock terminal CK3 is connected to the third clock line clk3 and the fourth clock terminal CK4 is connected to the fourth clock line clk4; moreover, the first clock terminal CK1 of the (2k)-th touch electrode driving circuit in the touch electrode driving circuits TXD(1), TXD (2), . . . , TXD(N-1) and TXD(N) is connected to the third clock line clk3, the second clock terminal CK2 is connected to the fourth clock line clk4, the third clock terminal CK3 is connected to the first clock line clk1 and the fourth clock terminal CK4 is connected to the second clock line clk2; wherein k is a positive integer and 2k≤N. It will be understood that the first, the second, the third and the fourth clock signals are supplied to the touch electrode driving circuits TXD(1), TXD(2), . . . , TXD(N-1) and TXD(N) in such a manner that each of the touch electrode driving circuits is operated in the same (but "time-shifted") sequence so as to sequentially generate output signals STV_OUT[1], STV_OUT[2], STV_OUT[3], . . . , STV_OUT[N] as a input pulse of the next stage touch electrode driving circuit and meanwhile as a reset pulse of the previous stage touch electrode driving circuit.

Figure 5:
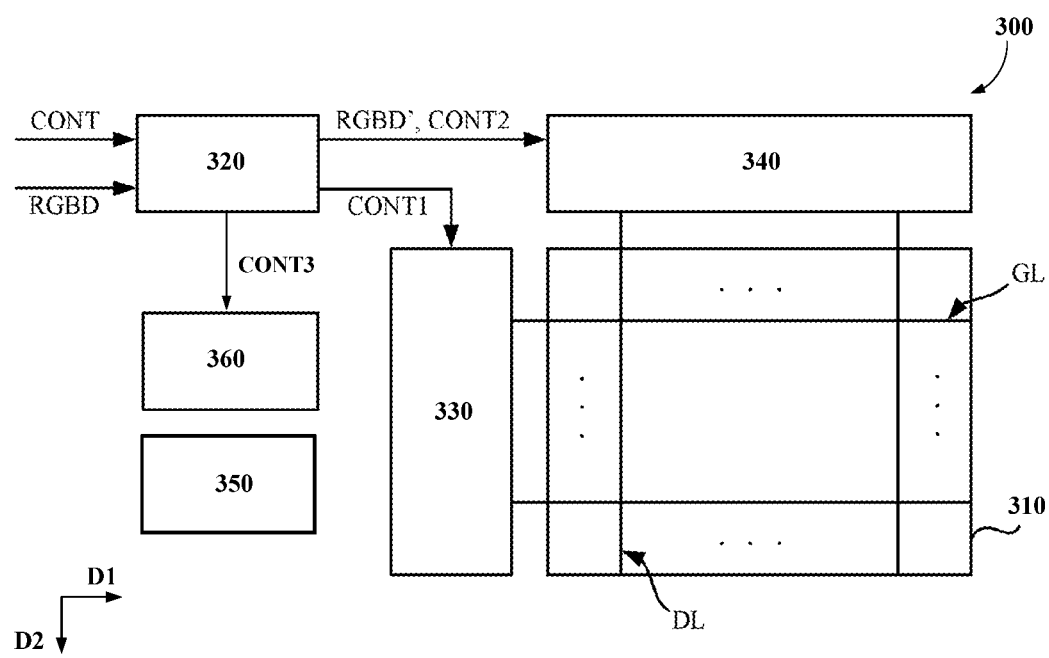
FIG. 5 is an exemplary block diagram of a touch display device according to an exemplary embodiment.

FIG. 5 is a block diagram of a touch display device 300 according to an exemplary embodiment. Referring to FIG. 5, the touch display device 300 comprises a touch display panel 310, a timing sequence controller 320, a gate driver 330, a data driver 340, a voltage generator 350 and a touch driver 360. The touch driver 360 can be in the form of the touch electrode driving circuit 100 as shown in FIGS. 1 and 2 and the touch electrode driver 200 as shown in FIG. 4.

Besides, the first voltage line cn, the second voltage line cnb, the third voltage line vgh, the fourth voltage line vgl, the touch control signal line tx_en, the touch signal line tx, the common voltage signal line vcom, the first common voltage control signal line vcom_en1, the second common voltage control signal line vcom_en2, the first clock line clk1, the second clock line clk2, the third clock line clk3 and the fourth clock line clk4, as shown in FIG. 4, are omitted in FIG. 5 for the convenience of illustration.

The touch display panel 310 is used for displaying received image data and sense touch operations of a user on the touch display panel 310. The touch display panel 310 may have a structure of different types, such as add-on, in-cell, on-cell, OGS and so on. The touch display panel 310 comprises a plurality of gate lines GL extending in a first direction D1 and a plurality of data lines DL extending in a second direction D2 intersecting (e.g., substantially perpendicular to) the first direction D1. A display panel of the touch display panel 310 comprises a plurality of pixels arranged in a matrix (not shown). Each of the pixels can be electrically connected to a corresponding one of the gate lines GL and a corresponding one of the data lines DL. The display panel of the touch display panel 310 can be a liquid crystal display panel, an organic light emitting diode (OLED) display panel or a display panel of any other suitable type.

The timing sequence controller 320 controls the operations of the touch display panel 310, the gate driver 330, the data driver 340, the voltage generator 350 and the touch driver 360. The timing sequence controller 320 receives from an external device (e.g., a host computer) input image data RGBD and an input control signal CONT. The input image data RGBD may comprise a plurality of input pixel data for the plurality of pixels. Each input pixel data may comprise red grayscale data R, green grayscale data G and blue grayscale data B for a corresponding one of the plurality of pixels. The input control signal CONT may comprise a master clock signal, a data enable signal, a vertical synchronization signal, a horizontal synchronization signal and so on. The timing sequence controller 320 generates output image data RGBD', a first control signal CONT1, a second control signal CONT2 and a third control signal CONT3 based on the input image data RGBD and the input control signal CONT. The implementation of the timing sequence controller 320 is known in the art. It can be implemented in many ways (e.g., by means of dedicated hardware) so as to execute different functions as discussed herein. "Processor" is an example of the timing sequence controller 320 using one or more microprocessors, and the micro-processors can be programmed by using software (e.g., microcodes) so as to execute different functions as discussed herein. The timing sequence controller 320 may be implemented with or without processors, and it may also be implemented as a combination of dedicated hardware for executing some functions and processors for executing other functions. Examples of the timing sequence controller 320 include but are not limited to conventional microprocessors, application specific integrated circuits (ASIC), and field programmable gate arrays (FPGA).

The gate driver 330 receives a first control signal CONT1 from the timing sequence controller 320. The gate driver 330 generates based on the first control signal CONT1 a plurality of gate driving signals to be outputted to the gate lines GL. The gate driver 330 may apply the plurality of gate driving signals to the gate lines GL sequentially.

The data driver 340 receives the second control signal CONT2 and the output image data RGBD' from the timing sequence controller 320. The data driver 340 generates a plurality of data voltages based on the second control signal CONT2 and the output image data RGBD'. The data driver 340 may apply the generated plurality of data voltages to the data lines DL.

The touch driver 360 receives the third control signal CONT3 from the timing sequence controller 320. The third control signal CONT3 may comprise the first, the second, the third and the fourth clock signals as shown in FIGS. 3 and 4, and the touch signal, the touch control signal, the first and the second common voltage control signals as well. The touch driver 360 may generate based on the third control signal CONT3 a touch scan signal to be outputted to the touch electrode, and provide it to the touch display panel 310.

The voltage generator 350 provides power to the touch display panel 310, the timing sequence controller 320, the gate driver 330, the data driver 340, the touch driver 360 and potentially further components. Specifically, the voltage generator 350 is configured to provide, under the control of the timing sequence controller 320, a first voltage, a second voltage, a third voltage and a fourth voltage transferred respectively by the first voltage line cn, the second voltage line cnb, the third voltage line vgh and the fourth voltage line vgl as shown in FIG. 4. The configuration of the voltage generator 350 can be chosen from those known in the art. In one implementation, the voltage generator 350 may comprise a voltage converter such as a DC/DC converter and a crossbar switch. The voltage converter generates a plurality of output voltages having different voltage levels based on the input voltage. Then, the crossbar switch may selectively couple these output voltages to the first voltage line cn, the second voltage line cnb, the third voltage line vgh and the fourth voltage line vgl under the control of the timing sequence controller 320 so as to supply the required voltages.

Examples of the touch display device 300 include but are not limited to cellphones, tablet computers, televisions, displays, notebook computers, digital photo frames, and navigators.

These are specific exemplary embodiments and should not be construed as limiting the scope of the disclosure. Those skilled in the art can make various modifications and variations to the disclosure without deviating from spirits and scopes of the disclosure, and these modifications and variations should also be deemed as falling within the scope of the disclosure.

The invention claimed is:

1. A touch electrode driving circuit, comprising:
an input terminal, operable to receive an input pulse;
a reset terminal, operable to receive a reset pulse;
a first voltage terminal, operable to be applied with a first voltage;
a second voltage terminal, operable to be applied with a second voltage;
a third voltage terminal, operable to be applied with a third voltage;
a fourth voltage terminal, operable to be applied with a fourth voltage;
a common voltage signal terminal, operable to be applied with a common voltage signal;
a first common voltage signal control terminal, operable to be applied with a first common voltage control signal;
a second common voltage signal control terminal, operable to be applied with a second common voltage control signal;

a first clock signal terminal, operable to receive a first clock signal;

a second clock signal terminal, operable to receive a second clock signal;

a third clock signal terminal, operable to receive a third clock signal;

a fourth clock signal terminal, operable to receive a fourth clock signal;

a touch signal terminal, operable to receive a touch scan signal;

a touch control signal terminal, operable to receive a touch control signal;

a first output terminal, operable to output a first output signal;

a second output terminal, operable to output a second output signal;

a third output terminal, operable to output a third output signal;

an input circuit, configured to: bring the first voltage terminal into conduction with a first node in response to the input pulse received at the input terminal being active; and bring the second voltage terminal into conduction with the first node in response to the reset pulse received at the reset terminal being active;

a first control circuit, configured to: bring the first voltage terminal into conduction with a second node in response to the third clock signal received at the third clock signal terminal being active; and bring the second voltage terminal into conduction with the second node in response to the fourth clock signal received at the fourth clock signal terminal being active;

a second control circuit, configured to: bring the fourth voltage terminal into conduction with the first node in response to the second node being at an active potential;

a third control circuit, configured to: bring the first clock signal terminal into conduction with a third node in response to the first node being at an active potential; and bring the fourth voltage terminal into conduction with the third node in response to the second node being at an active potential;

a fourth control circuit, configured to: bring the second clock signal terminal into conduction with a fourth node in response to the first node being at an active potential; and bring the fourth voltage terminal into conduction with the fourth node in response to the second node being at an active potential; wherein the fourth node is connected with the third output terminal;

a fifth control circuit, configured to: bring a fifth node into conduction with the touch control signal terminal in response to the third node being at an active potential; and bring the fourth voltage terminal into conduction with the fifth node in response to the first common voltage control signal received at the first common voltage signal control terminal being active;

a sixth control circuit, configured to: bring a sixth node into conduction with the touch control signal terminal in response to the fourth node being at an active potential; and bring the fourth voltage terminal into conduction with the sixth node in response to the second common voltage control signal received at the second common voltage signal control terminal being active;

a first output circuit, configured to: bring the first output terminal into conduction with the touch signal terminal in response to the fifth node being at an active potential; and bring the common voltage signal terminal into conduction with the first output terminal in response to the fifth node being at an inactive potential; and a second output circuit, configured to: bring the second output terminal into conduction with the touch signal terminal in response to the sixth node being at an active potential; and bring the common voltage signal terminal into conduction with the second output terminal in response to the sixth node being at an inactive potential.

2. The touch electrode driving circuit according to claim 1, wherein the input circuit comprises:

a first transistor, comprising a gate connected to the input terminal, a first electrode connected to the first voltage terminal, and a second electrode connected to the first node;

a second transistor, comprising a gate connected to the reset terminal, a first electrode connected to the first node, and a second electrode connected to the second voltage terminal; and a first capacitor, comprising a first electrode connected to the first node, and a second electrode connected to the fourth voltage terminal.

3. The touch electrode driving circuit according to claim 1, wherein the first control circuit comprises:

a third transistor, comprising a gate connected to the third clock signal terminal, a first electrode connected to the first voltage terminal;

a fourth transistor, comprising a gate connected to the fourth clock signal terminal, a second electrode connected to the second voltage terminal;

a fifth transistor, comprising a gate connected to the third voltage terminal, a first electrode connected to the second node; and wherein a second electrode of the third transistor, a first electrode of the fourth transistor and a second electrode of the fifth transistor are connected together.

4. The touch electrode driving circuit according to claim 1, wherein the second control circuit comprises a sixth transistor, comprising a gate connected to the second node, a first electrode connected to the first node, and a second electrode connected to the fourth voltage terminal.

5. The touch electrode driving circuit according to claim 4, wherein the second control circuit further comprises a second capacitor, comprising a first electrode connected to the second node, and a second electrode connected to the fourth voltage terminal.

6. The touch electrode driving circuit according to claim 1, wherein the third control circuit comprises:

a seventh transistor, comprising a gate connected to the third voltage terminal, a second electrode connected to the first node;

a ninth transistor, comprising a first electrode connected to the first clock signal terminal, a second electrode connected to the third node;

a tenth transistor, comprising a gate connected to the second node, a first electrode connected to the third node, and a second electrode connected to the fourth voltage terminal;

a third capacitor, comprising a second electrode connected to the third node; and wherein a first electrode of the seventh transistor, a gate of the ninth transistor and a first electrode of the third capacitor are connected together.

7. The touch electrode driving circuit according to claim 6, wherein the third control circuit further comprises an eleventh transistor, comprising a gate connected to the first node, a first electrode connected to the second node, and a second electrode connected to the fourth voltage terminal, wherein the eleventh transistor supplies the fourth voltage at the fourth voltage terminal to the second node in response to the first node being at an active potential.

8. The touch electrode driving circuit according to claim 1, wherein the fourth control circuit comprises:
   an eighth transistor, comprising a gate connected to the third voltage terminal, a second electrode connected to the first node;
   a twelfth transistor, comprising a first electrode connected to the second clock signal terminal, a second electrode connected to the fourth node;
   a fourteenth transistor, comprising a gate connected to the second node, a first electrode connected to the fourth node, and a second electrode connected to the fourth voltage terminal;
   a fourth capacitor, comprising a second electrode connected to the fourth node; and
   wherein a first electrode of the eighth transistor, a gate of the twelfth transistor and a first electrode of the fourth capacitor are connected together.

9. The touch electrode driving circuit according to claim 8, wherein the fourth control circuit further comprises a thirteenth transistor, comprising a gate connected to the first node, a first electrode connected to the second node, and a second electrode connected to the fourth voltage terminal, wherein the thirteenth transistor supplies the fourth voltage at the fourth voltage terminal to the second node in response to the first node being at an active potential.

10. The touch electrode driving circuit according to claim 1, wherein the fifth control circuit comprises:
    a fifteenth transistor, comprising a gate connected to the third node, a first electrode connected to the touch control signal terminal, and a second electrode connected to the fifth node; and
    a sixteenth transistor, comprising a gate connected to the first common voltage signal control terminal, a first electrode connected to the fifth node, and a second electrode connected to the fourth voltage terminal.

11. The touch electrode driving circuit according to claim 1, wherein the sixth control circuit comprises:
    a twenty-first transistor, comprising a gate connected to the fourth node, a first electrode connected to the touch control signal terminal, and a second electrode connected to the sixth node; and
    a twenty-second transistor, comprising a gate connected to the second common voltage signal control terminal, a first electrode connected to the sixth node, and a second electrode connected to the fourth voltage terminal.

12. The touch electrode driving circuit according to claim 1, wherein the first output circuit comprises:
    a seventeenth transistor, comprising a gate and a first electrode both connected to the third voltage terminal;
    an eighteenth transistor, comprising a gate connected to the fifth node, a second electrode connected to the fourth voltage terminal;
    a nineteenth transistor, comprising a gate connected to the fifth node, a first electrode connected to the touch signal terminal, and a second electrode connected to the first output terminal;
    a twentieth transistor, comprising a first electrode connected to the first output terminal, a second electrode connected to the common voltage signal terminal; and
    wherein a second electrode of the seventeenth transistor, a first electrode of the eighteenth transistor and a gate of the twentieth transistor are connected together.

13. The touch electrode driving circuit according to claim 12, wherein the first output circuit further comprises a fifth capacitor, comprising a first electrode connected to the fifth node, and a second electrode connected to the first output terminal.

14. The touch electrode driving circuit according to claim 13, wherein the first output circuit further comprises a sixth capacitor, comprising a first electrode connected to the gate of the twentieth transistor, and a second electrode connected to the fourth voltage terminal.

15. The touch electrode driving circuit according to claim 1, wherein the second output circuit comprises:
    a twenty-third transistor, comprising a gate and a first electrode both connected to the third voltage terminal;
    a twenty-fourth transistor, comprising a gate connected to the sixth node, a second electrode connected to the fourth voltage terminal;
    a twenty-fifth transistor, comprising a gate connected to the sixth node, a first electrode connected to the touch signal terminal, and a second electrode connected to the second output terminal;
    a twenty-sixth transistor, comprising a first electrode connected to the second output terminal, a second electrode connected to the common voltage signal terminal; and
    wherein a second electrode of the twenty-third transistor, a first electrode of the twenty-fourth transistor and a gate of the twenty-sixth transistor are connected together.

16. The touch electrode driving circuit according to claim 15, wherein the second output circuit further comprises a seventh capacitor, comprising a first electrode connected to the sixth node, and a second electrode connected to the second output terminal.

17. The touch electrode driving circuit according to claim 16, wherein the second output circuit further comprises an eighth capacitor, comprising a first electrode connected to the gate of the twenty-sixth transistor, and a second electrode connected to the fourth voltage terminal.

18. A touch electrode driver, comprising:
    a first voltage line, operable to transfer a first voltage;
    a second voltage line, operable to transfer a second voltage;
    a third voltage line, operable to transfer a third voltage;
    a fourth voltage line, operable to transfer a fourth voltage;
    a common voltage signal line, operable to be applied with a common voltage signal;
    a first common voltage signal control line, operable to be applied with a first common voltage control signal;
    a second common voltage signal control line, operable to be applied with a second common voltage control signal;
    a first clock line, operable to receive a first clock signal;
    a second clock line, operable to receive a second clock signal;
    a third clock line, operable to receive a third clock signal;
    a fourth clock line, operable to receive a fourth clock signal;
    a touch signal line, operable to receive a touch scan signal;
    a touch control signal line, operable to receive a touch control signal;
    N touch electrode driving circuits according to claim 1 connected in cascade, N being an integer greater than or equal to 2, wherein a third output terminal of the m-th touch electrode driving circuit in the N touch electrode driving circuits is connected to an input terminal of the (m+1)-th touch electrode driving circuit in the N touch electrode driving circuits, m being an integer and 1≤m<N, and wherein a third output terminal of the n-th touch electrode driving circuit in the N touch electrode driving circuits is connected to a reset terminal of the (n−1)-th touch electrode driving circuit in the N touch electrode driving circuits, n being an integer and 1<n≤N, wherein:

each of first voltage terminals of the N touch electrode driving circuits is connected to the first voltage line;

each of second voltage terminals of the N touch electrode driving circuits is connected to the second voltage line;

each of third voltage terminals of the N touch electrode driving circuits is connected to the third voltage line;

each of fourth voltage terminals of the N touch electrode driving circuits is connected to the fourth voltage line;

each of common voltage signal terminals of the N touch electrode driving circuits is connected to the common voltage signal line;

each of first common voltage signal control terminals of the N touch electrode driving circuits is connected to the first common voltage signal control line;

each of second common voltage signal control terminals of the N touch electrode driving circuits is connected to the second common voltage signal control line;

each of touch signal terminals of the N touch electrode driving circuits is connected to the touch signal line;

each of touch control signal terminals of the N touch electrode driving circuits is connected to the touch control signal line;

a first clock signal terminal of the (2k−1)-th touch electrode driving circuit in the N touch electrode driving circuits is connected to the first clock line, a second clock signal terminal thereof is connected to the second clock line, a third clock signal terminal thereof is connected to the third clock line, and a fourth clock signal terminal thereof is connected to the fourth clock line; a first clock signal terminal of the (2k)-th touch electrode driving circuit in the N touch electrode driving circuits is connected to the third clock line, a second clock signal terminal thereof is connected to the fourth clock line, a third clock signal terminal thereof is connected to the first clock line, and a fourth clock signal terminal thereof is connected to the second clock line; wherein k is a positive integer and 2k≤N.

19. A touch display device, comprising:

the touch electrode driver according to claim 18;

a timing sequence controller, configured to: supply the first clock signal, the second clock signal, the third clock signal and the fourth clock signal to the first clock line, the second clock line, the third clock line and the fourth clock line respectively, and provide the first common voltage control signal to the first common voltage signal control line, provide the second common voltage control signal to the second common voltage signal control line, provide the touch control signal to the touch control signal line, and provide the touch signal to the touch signal line;

a voltage generator, configured to at least supply the first voltage, the second voltage, the third voltage, the fourth voltage and the common voltage signal to the first voltage line, the second voltage line, the third voltage line, the fourth voltage line and the common voltage signal line respectively; and a touch display panel, configured to display received image data and sense touch operations of a user.

* * * * *